United States Patent
Hsieh et al.

(10) Patent No.: US 8,772,183 B2
(45) Date of Patent: Jul. 8, 2014

(54) METHOD OF FORMING AN INTEGRATED CIRCUIT

(75) Inventors: Tzu-Yen Hsieh, Taipei (TW); Chang Ming-Ching, Hsinchu (TW); Chun-Hung Lee, Zhudong Town (TW); Yih-Ann Lin, Jhudong Township (TW); De-Fang Chen, Lujhu Township (TW); Chao-Cheng Chen, Shin-Chu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 404 days.

(21) Appl. No.: 13/277,552

(22) Filed: Oct. 20, 2011

(65) Prior Publication Data
US 2013/0102136 A1    Apr. 25, 2013

(51) Int. Cl.
*H01L 21/00* (2006.01)

(52) U.S. Cl.
USPC ........... 438/798; 438/540; 438/942; 438/947; 438/949; 438/951; 257/E21.38; 257/E21.39

(58) Field of Classification Search
USPC ................. 438/510, 942, 947, 949, 950, 951; 257/E21.38, E21.39
See application file for complete search history.

(56) References Cited

U.S. PATENT DOCUMENTS

| | | | | |
|---|---|---|---|---|
| 5,336,630 A * | 8/1994 | Yun et al. | | 438/253 |
| 6,110,837 A * | 8/2000 | Linliu et al. | | 438/723 |
| 6,124,212 A * | 9/2000 | Fan et al. | | 438/709 |
| 6,261,964 B1 * | 7/2001 | Wu et al. | | 438/705 |
| 6,309,975 B1 * | 10/2001 | Wu et al. | | 438/705 |
| 6,461,967 B2 * | 10/2002 | Wu et al. | | 438/705 |
| 6,596,648 B2 * | 7/2003 | Wu et al. | | 438/745 |
| 6,599,840 B2 | 7/2003 | Wu et al. | | |
| 6,667,237 B1 * | 12/2003 | Metzler | | 438/690 |
| 6,734,107 B2 * | 5/2004 | Lai et al. | | 438/696 |
| 6,897,517 B2 * | 5/2005 | Van Houdt et al. | | 257/315 |
| 7,183,205 B2 | 2/2007 | Hong | | |
| 7,253,113 B2 * | 8/2007 | Cheng | | 438/703 |
| 7,429,536 B2 * | 9/2008 | Abatchev et al. | | 438/725 |
| 7,550,391 B2 * | 6/2009 | Jeon et al. | | 438/717 |
| 7,811,940 B2 * | 10/2010 | Sandhu | | 438/717 |
| 8,334,211 B2 * | 12/2012 | Kewley | | 438/696 |
| 8,486,287 B2 * | 7/2013 | Zhu et al. | | 216/41 |

(Continued)

OTHER PUBLICATIONS

Masahara, Meishoku et al., "Ultrathin Channel Vertical DG MOSFET Fabricated by Using Ion-Bombardment-Retarded Etching", IEEE Transactions on Electron Devices, vol. 51, No. 12, Dec. 2004, pp. 2078-2085.

*Primary Examiner* — Thao X Le
*Assistant Examiner* — Eric Jones
(74) *Attorney, Agent, or Firm* — Lowe Hauptman & Ham, LLP

(57) ABSTRACT

A method of forming an integrated circuit is disclosed. A second material layer is formed on a first material layer. A patterned mask layer having a plurality of first features with a first pitch $P_1$ is formed on the second material layer. The second material layer is etched by using the patterned mask layer as a mask to form the first features in the second material layer. The patterned mask layer is trimmed. A plurality of dopants is introduced into the second material layer not covered by the trimmed patterned mask layer. The trimmed patterned mask layer is removed to expose un-doped second material layer. The un-doped second material layer is selectively removed to form a plurality of second features with a second pitch $P_2$. $P_2$ is smaller than $P_1$.

20 Claims, 4 Drawing Sheets

(56) References Cited

U.S. PATENT DOCUMENTS

| | | | |
|---|---|---|---|
| 2002/0001960 A1* | 1/2002 | Wu et al. | 438/705 |
| 2002/0182816 A1* | 12/2002 | Wu et al. | 438/345 |
| 2002/0182872 A1* | 12/2002 | Wu et al. | 438/705 |
| 2002/0187648 A1* | 12/2002 | Wu et al. | 438/745 |
| 2003/0091936 A1* | 5/2003 | Rottstegge et al. | 430/312 |
| 2005/0059231 A1* | 3/2005 | Nakagawa et al. | 438/622 |
| 2005/0272259 A1 | 12/2005 | Hong | |
| 2007/0190711 A1* | 8/2007 | Luo et al. | 438/197 |
| 2008/0090418 A1* | 4/2008 | Jeon et al. | 438/689 |

* cited by examiner

METHOD OF FORMING AN INTEGRATED CIRCUIT

TECHNICAL FIELD

The disclosure relates generally to integrated circuit fabrication methods and, more particularly, to a method of fabricating an integrated circuit with a reduced pitch.

BACKGROUND

Integrated circuits are commonly used to make a wide variety of electronic devices, such as memory chips. One aim in production is to reduce the size of integrated circuits, so as to increase the density of the individual components and consequently enhance the functionality of an integrated circuit. The minimum pitch on an integrated circuit (the minimum distance between the same points of two adjacent structures of the same type, e.g., two adjacent gate conductors) is often used as a representative measure of the circuit's density. The feature width is sometimes referred to herein as F, and the width of the space between features is sometimes referred to herein as S.

Increases in circuit density often are limited by the resolution of the available photolithographic equipment. The minimum size of features and spaces that a given piece of photolithographic equipment can produce is related to its resolution capability. If one tries to define features in a photoresist which are smaller than the machine's minimum feature size, then the photoresist regions exposed to radiation may fail to correspond to the mask plate pattern, resulting in the photoresist features not being accurately reproduced.

Some attempts have been made to try to reduce the pitch of an integrated circuit device below that of the minimum pitch produced lithographically, but these methods are difficult to control and show varying results.

In view of the drawbacks of the prior methods, it is necessary to provide a method that can reduce the pitch in a device below that producible by the lithographic process.

BRIEF DESCRIPTION OF THE DRAWINGS

Exemplary embodiments will be described with reference to the accompanying figures. It should be understood that the drawings are for illustrative purposes and are therefore not drawn to scale.

DETAILED DESCRIPTION

The making and using of illustrative embodiments are discussed in detail below. It should be appreciated, however, that the disclosure provides many applicable inventive concepts that can be embodied in a wide variety of specific contexts. The specific embodiments discussed are merely illustrative and do not limit the scope of the disclosure.

It will be understood that when an element such as a layer, region or substrate is referred to as being "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As used herein, a particular patterned layer is "used as a mask" for a particular process step if it is the top layer present when the particular process step is performed, or if it is only an intermediate layer present when the particular process step is performed, as long as any superposing layers are patterned the same as or more narrowly than the particular layer. In other words, as used herein, if the structure includes two patterned layers, then each of them individually, as well as both of them together, are all considered herein to act as a "mask" for the particular process step. The presence of a superposing layer having the same or narrower pattern as the particular layer does not prevent the particular layer from being "used as a mask" for the particular process step.

The term "substrate" as described herein, refers to a semiconductor substrate on which various layers and integrated circuit components are formed. The substrate may comprise silicon or a compound semiconductor, such as GaAs, InP, Si/Ge, or SiC. Examples of layers may include dielectric layers, doped layers, metal layers, polysilicon layers and via plugs that may connect one layer to one or more layers. Examples of integrated circuit components may include transistors, resistors, and/or capacitors. The substrate may be part of a wafer that includes a plurality of semiconductor dies fabricated on the surface of the substrate, wherein each die comprises one or more integrated circuits. The semiconductor dies are divided by scribe lines (not shown) between adjacent dies. The following process steps will be performed on each of the semiconductor dies on the surface of the substrate.

Figure 1:
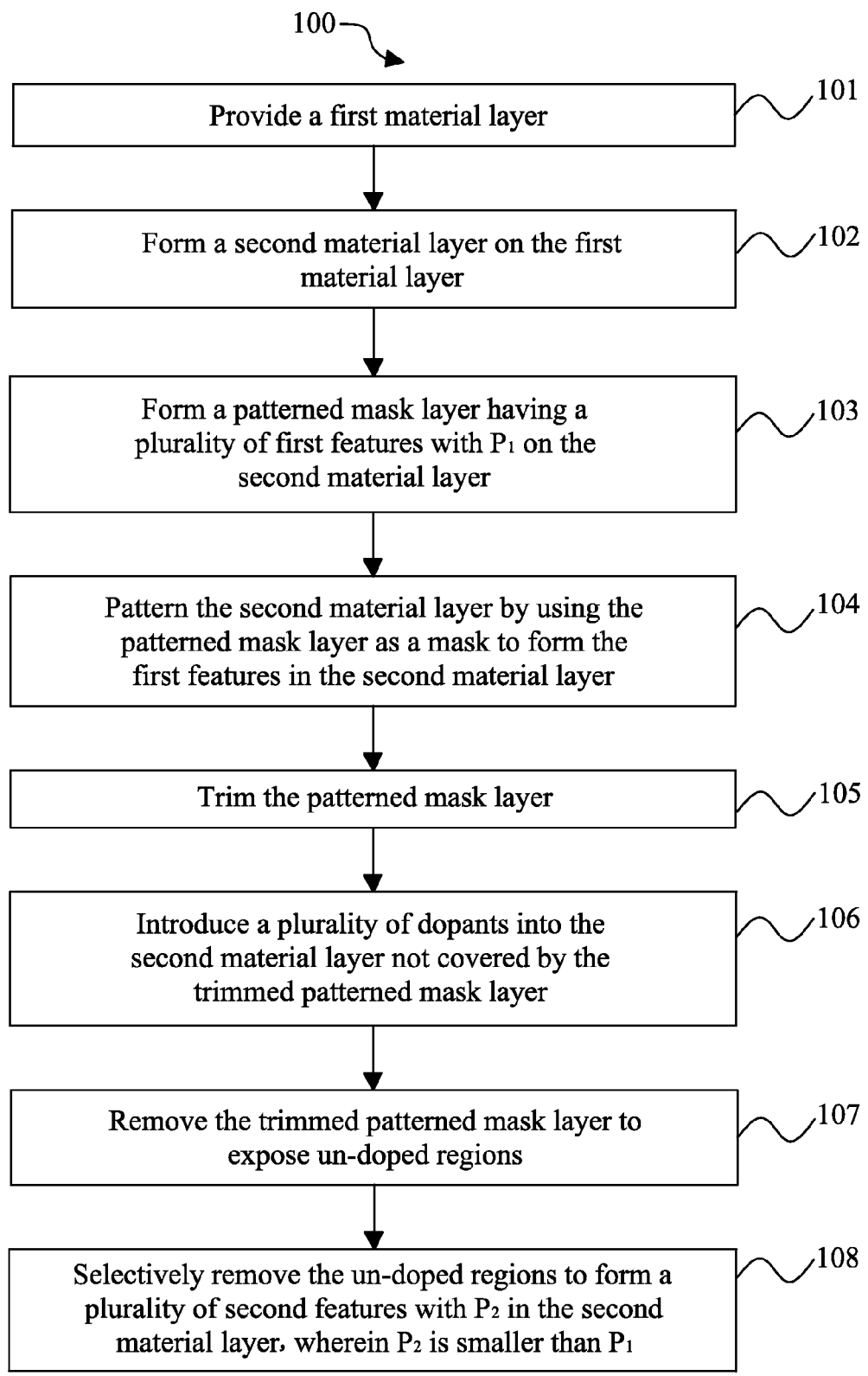
FIG. 1 is a flow chart of a method of forming a structure of an integrated circuit according to one or more embodiments of this disclosure.

FIG. 1 is a flow chart of a method 100 of forming a structure of an integrated circuit according to various embodiments of this disclosure. The method 100 begins at operation 101 where a first material layer is provided. At operation 102, a second material layer is formed on the first material layer. At operation 103, a patterned mask layer is formed on the second material layer. The patterned mask layer has a plurality of first features with a first pitch $P_1$. At operation 104, the second material layer is patterned by using the patterned mask layer as a mask. The first features are formed in the second material layer and a portion of a top surface of the first material layer is exposed. At operation 105, the patterned mask layer is trimmed after patterning the second material layer. A trimmed patterned mask layer is formed. At operation 106, a plurality of dopants is introduced into the second material layer not covered by the trimmed patterned mask layer. Various doped regions with a second pitch $P_2$ are formed in the second material layer. The second pitch $P_2$ is smaller than the first pitch $P_1$. At operation 107, the trimmed patterned mask layer is removed to expose various un-doped regions in the second material layer. At operation 108, the un-doped regions are selectively removed to form a plurality of second features in the second material layer. The plurality of second features corresponds to the respective doped regions in the second material layer. The plurality of second features has the second pitch $P_2$.

Referring to the drawings, FIGS. 2 to 7 depict cross-sectional views showing various stages during fabrication of a structure according to the method in FIG. 1.

Figure 2:
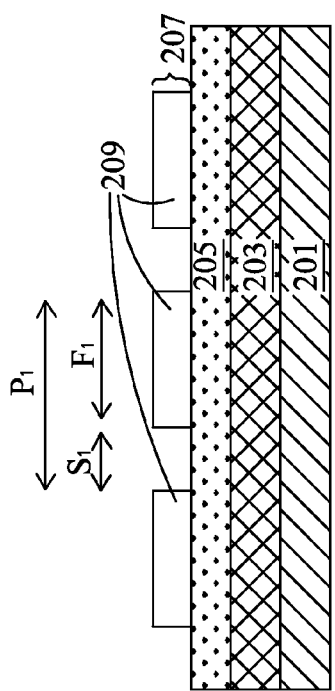
FIGS. 2 to 7 are cross-sectional views showing various stages during fabrication of a structure according to the method in FIG. 1.

Referring to FIG. 2, a first material layer 203, a second material layer 205 and a patterned mask layer 207 are sequentially formed over the substrate 201. The layers 203, 205 and 207 are patterned, as will be further discussed below, to form one or more features over the substrate 201. It is understood that any desired feature may be patterned in the material layers, such as lines, gate structures and shallow trench isolations (STIs), etc.

The first material layer 203 may include a dielectric layer (also referred to as dielectric layer 203) or a metal layer (also referred to as metal layer 203) formed over the substrate 201 by any suitable process, such as chemical vapor deposition (CVD) and physical vapor deposition (CVD). The dielectric layer 203 may comprise silicon oxide, silicon oxynitride, silicon nitride, a high-k dielectric layer comprising hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), transition metal-oxides, transition metal-nitrides, transition metal-silicates, metal aluminates, zirconium silicate, zirconium aluminate, zirconium oxide, titanium oxide, aluminum oxide, hafnium dioxide-alumina ($HfO_2$—$Al_2O_3$) alloy, and/or combinations thereof. The metal layer 203 may comprise aluminum, copper, titanium, tantulum, tantalum nitride, nickel silicide, cobalt silicide, TaC, TaSiN, metal alloys, and/or combinations thereof.

The second material layer 205 is formed over the first material layer 203 by any suitable process, such as chemical vapor deposition (CVD). In one example, the second material layer 205 comprises a silicon layer including a polysilicon layer, a single crystalline silicon layer or an amorphous silicon layer. The second material layer 205 that may be used as a mask layer for the underlying first material layer 203 for the following etching process. In other words, the second material layer 205 has a higher etch resistance than the first material layer 203 during the first material layer 203 etching process. The second material layer 205 is formed to any suitable thickness. For example, the second material layer 205 has a thickness of in a range approximately 300 to 2000 Å.

Next, the patterned mask layer 207 is formed over the second material layer 205. In one embodiment, the patterned mask layer 207 comprises a photo resist layer (also referred to as photo resist layer 207). The processes may include photoresist coating (e.g., spin-on coating), soft baking, mask aligning, exposure, post-exposure baking, developing the photoresist, rinsing, drying (e.g., hard baking), and/or combinations thereof. The patterned mask layer 207 has a plurality of first features 209 with a first pitch $P_1$ formed over the second material layer 205. The first pitch $P_1$ is the minimum distance between the same points of two adjacent first features 209. The first pitch $P_1$ equals a width F1 of the first feature 209 plus a first space S1 between adjacent the first features 209.

In another embodiment, various imaging enhancement layers are formed under photo resist layer 207 to enhance the pattern transfer of the first features 209 to the underlying layers. The imaging enhancement layer may comprise a trilayer including a bottom organic layer, a middle inorganic layer and a top organic layer. The imaging enhancement layer may also include an anti-reflective coating (ARC) material, a polymer layer, an oxide derived from TEOS (tetraethylorthosilicate), silicon oxide, or a Si-containing anti-reflective coating (ARC) material, such as a 42% Si-containing ARC layer.

In yet another embodiment, the patterned mask layer 207 comprises a hard mask layer. The hard mask layer comprises an oxide material, silicon nitride, silicon oxynitride, an amorphous carbon material, silicon carbide or tetraethylorthosilicate (TEOS). The patterned hard mask layer is formed by defining the first features 209 in an overlying patterned photo resist layer. The patterned photo resist layer is used as a mask for etching the underlying hard mask layer. After etching, the first features 209 are formed in the patterned hard mask layer and the patterned photo resist layer is removed.

Figure 3:
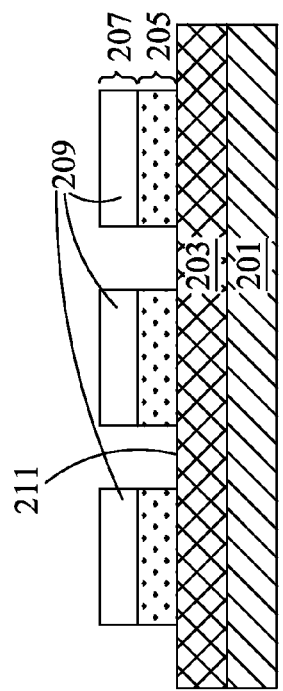

Referring to FIG. 3, the second material layer 205 is patterned by using the patterned mask layer 207 as a mask. The first features 209 in the patterned mask layer 207 are transferred to the second material layer 205 by etching the second material layer 205. In this embodiment, a polysilicon layer is used as the second material layer 205. The polysilicon layer is etched with a plasma process in a $Cl_2/HBr/O_2$ ambient environment. A portion of a top surface 211 of the first material layer 203 is exposed after the polysilicon layer etching process. During the second material layer 205 etching process, the first material layer 203 has a higher etch resistance than the second material layer 205. Less of the first material layer 203 is consumed compared to the second material layer 205 in this etching process. Most of the first material layer 203 remains.

Figure 4:
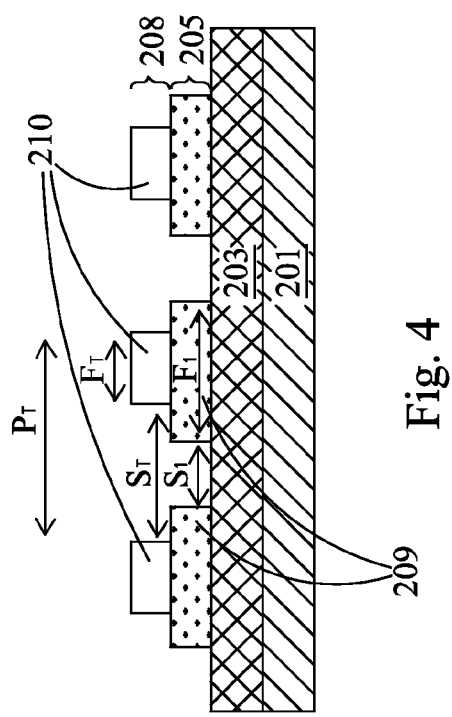

Referring to FIG. 4, the patterned mask layer 207 is trimmed to form a trimmed patterned mask layer 208. In this embodiment, a patterned photo resist layer is used as the patterned mask layer 207. The photo resist layer is etched with a plasma process in a $HBr/O_2$ ambient environment to form the trimmed patterned mask layer 208. The trimmed patterned mask layer 208 has a plurality of features 210 with a pitch $P_T$ formed over the first features 209 of the second material layer 205. The first space $S_1$ between adjacent the first features 209 in the patterned mask layer 207 is widened to a space $S_T$ between adjacent features 210 in the trimmed patterned mask layer 208. A width $F_T$ of the features 210 is less than the width $F_1$ of the first features 209.

Figure 5:
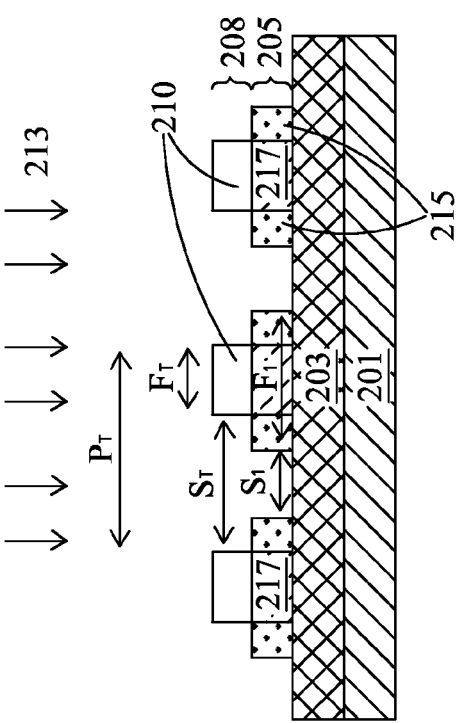

Referring to FIG. 5, a plurality of dopants 213 is introduced into the second material layer 205 not covered by the trimmed patterned mask layer 208 to form doped regions 215 in the second material layer 205. Namely, the features 210 in the trimmed patterned mask layer 208 are used as a mask to form un-doped regions 217. The width $F_T$ of the features 210 substantially equals a space $S_2$ between adjacent doped regions 215. A width $F_2$ of each doped region 215 substantially equals the difference between the width $F_1$ and the width $F_T$ divided by two. The sum of the width $F_2$ and the space $S_2$ (or the width $F_T$) equals a second pitch $P_2$ for doped regions 215. Since the width $F_T$ is less than the width $F_1$, the second pitch $P_2$ is smaller than the first pitch $P_1$.

In one example, the second material layer 205 is a polysilicon layer. The plurality of dopants 213 is substantially vertically implanted into the polysilicon layer. The dopants may include As, P, B, C, N, Si, Ge or $BF_2$. A dosage of the dopants is substantially higher than 1E15 ion/$cm^2$. The ion implantation creates different etching removal rates for the un-doped regions 217 and the doped region 215 in following removal process. The un-doped regions 217 may be selectively removed. Advantageously, since various dopants 213 are substantially vertically implanted, the second features 210 are accurately transferred from the trimmed patterned mask layer 208 into un-doped regions 217 in the second material layer 205. Edges of the un-doped regions 217 (also edges of doped regions 215) are vertically aligned with the corresponding sidewalls of the second features 210 in the trimmed patterned mask layer 208.

Figure 6:
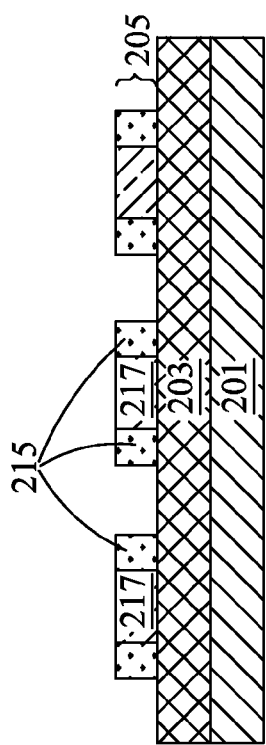

Referring to FIG. 6, the trimmed mask layer 208 is removed to expose un-doped regions 217 in the second material layer 205. In one example, the trimmed mask layer 208 is a photo resist layer. The photo resist layer may be ashed in an oxygen ambient environment.

Figure 7:
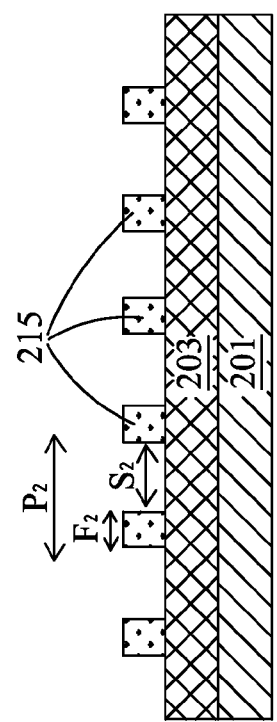

Referring to FIG. 7, the un-doped regions 217 are selectively removed to form a plurality of second features in the second material layer 205. The second features are corresponding to the respective doped regions 215. The un-doped region 217 has a higher etching removal rates than the doped regions 215 has in the removal process. In one embodiment, the second material layer 205 is a silicon layer. The un-doped regions 217 may be selectively removed in an etchant including tetramethyl ammonium hydroxide (TMAH), tetrabutylphosphonium hydroxide, tetraphenylarsonium hydroxide, KOH, NaOH or $NH_4OH$. When the etchant is TMAH, the etchant solution is in a range of about 1 to about 10 weight percent of TMAH in de-ionized water to create a shaped image of the second features in the second material layer 205. In another embodiment, the un-doped regions 217 may be removed by a dry etching process. The dry etching process has a higher etching removal rates for un-doped region 217 than doped region 215. After the un-doped region 217 removal process, the pattern of the doped regions 215 is transferred to the second features in the second material layer 205. A width, a space and a pitch of the second features substantially equal to the width $F_2$, the space $S_2$ and the pitch $P_2$ of the doped regions 215, respectively. The second features with a narrow pitch are fabricated.

In other embodiments, the first material layer 203 is etched by using the plurality of the second features in the second material layer 205 as a mask for fabricating the narrow pitch pattern in the first material layer 203.

Note that in all of the above embodiments, the feature narrowing process described herein can be repeated if desired, assuming appropriate materials are used in the starting structure of FIG. 2, and substrate 201 include appropriate sub-layers superimposing the bulk support material. The repeated feature narrowing process can be thought of as being constructed by adding a second instance of the process steps described above either before or after the first instance described above.

In the above embodiments, the doped regions 215 are formed at edge portions of the first features 209 in the second material layer 205 by means of processes which introduce a plurality of dopants into the second material layer 205. These processes can be implantation or thermal diffusion processes, as in the above-described embodiments, or can be another form of chemical reaction or inter-diffusion reaction in other embodiments. Any process that creates different etching removal rates for un-doped region 217 and doped region 215 will suffice, so long as the impact of the process on other materials in the structure is insignificant or otherwise accommodated.

In addition, it will be appreciated that the process of trimming the patterned mask layer 207 has the effect of reducing the width of the features in the second material layer 205. The following dopant introducing process replaces the volume of the second material layer 205 with a volume of doped regions 215 at edge portions of the first features 209. The final second feature has a width $F_2$ that is less than the starting width $F_1$ of the first feature 209.

In one embodiment, the first features 209 are formed in a regular repeated pattern of the width $F_1$ and one-third of the width $F_1$ for the space $S_1$, and the process can be used to form a new regular repeated pattern of doped regions 215 (also the secondfeatures). The doped region 215 has equal width $F_2$ and space $S_2$. The width $F_2$ is also substantially one-third of the width $F_1$. The space $S_2$ is also substantially the space $S_1$. Hence, the second pitch $P_2$ is substantially one-half of the first pitch $P_1$. This can be accomplished by using a trimming process in which $F_T = \frac{1}{3} F_1 = \frac{1}{3} S_T$.

In another embodiment, the first features 209 are formed in a regular repeated pattern of the width $F_1$ and one-half of the width $F_1$ for the space $S_1$, and the process can be used to form a new regular repeated pattern of doped regions 215 (also the second features). The width $F_2$ substantially equals one-quarter of the width $F_1$. The space $S_2$ substantially equals the space $S_1$. Hence, the second pitch $P_2$ is substantially one-half of the first pitch $P_1$. This can be accomplished by using a trimming process in which $F_T = \frac{1}{2} F_1 = \frac{1}{2} S_T$.

In other embodiments, $F_T$ can be greater or less than $\frac{1}{3} F_1$, and/or $F_T$ can be greater or less than $\frac{1}{3} S_T$, and/or the original patterned mask layer 207 may not be formed in regular pattern of equal width and space. Variations such as these and others can be used to produce various different sub-lithographic features patterns as desired in the resulting integrated structure.

Various embodiments of the present invention may be used to improve the method of fabricating an integrated circuit with a reduced pitch. For example, during the processes for pitch reduction, only one lithograph process is needed to define the starting features in the patterned mask layer. There is no overlay issue that comes from the features formed by another lithograph process. In other pitch reduction methods, the patterned mask layer may be composed of two similar initial features. Each feature has it own film stack. When the patterned mask layer is used as a mask to perform an etching process on a specific layer, the resulting features in the specific layer will generate two groups due to the influence from the film stack of the initial features. The resulting features have different dimensions in the completed products. The device performance and yield are thus hard to control. The processes in this disclosure are performed in a way of pattern transference in the same stacking film. The resulting features have the identical dimension. The device performance and yield of the completed products are easily controlled. The disclosed embodiments increase the flexibility to allocate different products for the production line.

One embodiment of the disclosure describes a method of forming an integrated circuit. The method includes providing a first material layer. A second material layer is formed on the first material layer. A patterned mask layer is formed on the second material layer. The patterned mask layer has a plurality of first features with a first pitch $P_1$. The second material layer is patterned by using the patterned mask layer as a mask for form the first features in the second material layer. A portion of a top surface of the first material layer is exposed. After patterning the second material layer, the patterned mask layer is trimmed to form a trimmed patterned mask layer. A plurality of dopants is introduced into the second material layer not covered by the trimmed patterned mask layer to form doped regions with a second pitch $P_2$. The second pitch $P_2$ is smaller than the first pitch $P_1$. The trimmed patterned mask layer is removed to expose un-doped regions in the second material layer. The un-doped regions are selectively removed to form a plurality of second features corresponding to the respective doped regions in the second material layer.

Another embodiment of the disclosure describes a method of forming an integrated circuit. The method includes providing a first material layer. A second material layer is formed on the first material layer. A patterned mask layer is formed on the second material layer. The patterned mask layer has a plurality of first features with a first pitch $P_1$. Each first feature has a first space $S_1$ to adjacent first features. The second material layer is etched by using the patterned mask layer as a mask for form the first features in the second material layer. A portion of a top surface of the first material layer is exposed. The first space $S_1$ in the patterned mask layer is widened to a space $S_T$. After widening the first space $S_1$, a plurality of dopants is implanted into the second material layer not covered by the patterned mask layer. The patterned mask layer is removed to expose un-doped second material layer. The un-doped second material is selectively removed to form a plurality of second features with a second pitch $P_2$ in the second material layer. The second pitch $P_2$ is substantially one-half of the first pitch $P_1$.

Yet another embodiment of the disclosure describes a method of forming an integrated circuit. The method includes providing a first material layer. A silicon layer is formed on the first material layer. A patterned mask layer is formed on the silicon layer. The patterned mask layer has a plurality of first features with a first pitch $P_1$. The silicon layer is patterned by using the patterned mask layer as a mask for form the first features in the silicon layer. A portion of a top surface of the first material layer is exposed. After patterning the silicon layer, the patterned mask layer is trimmed to form a trimmed patterned mask layer. A plurality of dopants is substantially vertically implanted into the silicon layer not covered by the trimmed patterned mask layer. The trimmed patterned mask layer is removed to expose un-doped silicon layer. The un-doped silicon layer is selectively removed with an etchant to form a plurality of second features with a second pitch $P_2$ in the silicon layer, wherein the second pitch $P_2$ is smaller than the first pitch $P_1$.

Although the embodiments and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. Accordingly, the appended claims are intended to include within their scope such processes, machines, manufacture, compositions of matter, means, methods, or steps that perform substantially the same function or achieve substantially the same result as the corresponding embodiments described herein.

What is claimed is:

1. A method of forming an integrated circuit, the method comprising:
   providing a first material layer;
   forming a second material layer on the first material layer;
   forming a patterned mask layer having a plurality of first features with a first pitch $P_1$ on the second material layer;
   patterning the second material layer by using the patterned mask layer as a mask to form the first features in the second material layer and expose a portion of a top surface of the first material layer;
   trimming the patterned mask layer after patterning the second material layer to form a trimmed patterned mask layer;
   introducing a plurality of dopants into the second material layer not covered by the trimmed patterned mask layer to form doped regions with a second pitch $P_2$, wherein the second pitch $P_2$ is smaller than the first pitch $P_1$;
   removing the trimmed patterned mask layer to expose un-doped regions in the second material layer;
   selectively removing the un-doped regions to form a plurality of second features corresponding to the respective doped regions in the second material layer.

2. The method of claim 1, wherein the second pitch $P_2$ is substantially one-half of the first pitch $P_1$.

3. The method of claim 1, wherein the step of selectively removing comprises removing the un-doped regions with an etchant, wherein the etchant has a higher etching removal rate for the un-doped regions than for the doped regions.

4. The method of claim 1, wherein the second material layer comprises a polysilicon layer, a single crystalline silicon layer, or an amorphous silicon layer.

5. The method of claim 4, wherein the step of selectively removing comprises removing the un-doped regions with an etchant, the etchant comprising tetramethyl ammonium hydroxide (TMAH), tetrabutylphosphonium hydroxide, tetraphenylarsonium hydroxide, KOH, NaOH or $NH_4OH$.

6. The method of claim 4, wherein the dopants comprise As, P, B, C, N, Si, Ge or $BF_2$.

7. The method of claim 4, wherein a dosage of the dopants is substantially higher than 1E15 ion/cm$^2$.

8. The method of claim 1, wherein step of introducing the plurality of dopants comprises substantially vertically implanting the plurality of dopants into the second material layer.

9. The method of claim 1, further comprising etching the first material layer by using the plurality of second features as a mask.

10. The method of claim 1, wherein sidewalls of each second feature are vertically aligned with corresponding sidewalls of the trimmed patterned mask layer.

11. The method of claim 1, wherein sidewalls of each second feature are vertically aligned with corresponding sidewalls of the trimmed patterned mask layer.

12. The method of claim 1, wherein the step of selectively removing comprises removing the un-doped silicon layer with an etchant, wherein the etchant has a higher etching removal rate for the un-doped silicon layer than for the doped silicon layer as a mask.

13. A method of forming an integrated circuit, the method comprising:
    providing a first material layer;
    forming a second material layer on the first material layer;
    forming a patterned mask layer having a plurality of first features with a first pitch $P_1$ on the second material layer, wherein each first feature has a first space $S_1$ to adjacent first features;
    etching the second material layer by using the patterned mask layer as a mask to form the first features in the second material layer and expose a portion of a top surface of the first material layer;
    widening the first space $S_1$ in the patterned mask layer to a space $S_T$;
    after widening the first space $S_1$, implanting a plurality of dopants into the second material layer not covered by the patterned mask layer;
    removing the patterned mask layer to expose un-doped second material layer;
    selectively removing the un-doped second material layer to form a plurality of second features with a second pitch $P_2$ in the second material layer, wherein the second pitch $P_2$ is substantially one-half of the first pitch $P_1$.

14. The method of claim 13, wherein the second material layer comprises a polysilicon layer, a single crystalline silicon layer or an amorphous silicon layer.

15. The method of claim 14, wherein the etchant comprises tetramethyl ammonium hydroxide (TMAH), tetrabutylphosphonium hydroxide, tetraphenylarsonium hydroxide, KOH, NaOH or $NH_4OH$.

16. The method of claim 14, wherein a dosage of the dopants is substantially higher than 1E15 ion/cm$^2$.

17. The method of claim 13, wherein the step of selectively removing comprises removing the un-doped second material layer with an etchant, wherein the etchant has a higher etching removal rate for the un-doped second material layer than for the doped second material layer.

18. The method of claim 13, wherein step of introducing the plurality of dopants comprises substantially vertically implanting the plurality of dopants into the second material layer.

19. The method of claim 13, further comprising etching the first material layer by using the plurality of second features as a mask.

20. A method of forming an integrated circuit, the method comprising:

providing a first material layer;

forming a silicon layer on the first material layer;

forming a patterned mask layer having a plurality of first features with a first pitch $P_1$ on the silicon layer;

patterning the silicon layer by using the patterned mask layer as a mask to form the first features in the silicon layer and expose a portion of a top surface of the first material layer;

trimming the patterned mask layer after patterning the silicon layer to form a trimmed patterned mask layer;

substantially vertically implanting a plurality of dopants into the silicon layer not covered by the trimmed patterned mask layer;

removing the trimmed patterned mask layer to expose an un-doped silicon layer;

selectively removing the un-doped silicon layer with an etchant to form a plurality of second features with a second pitch $P_2$ in the silicon layer, wherein the second pitch $P_2$ is smaller than the first pitch $P_1$.

\* \* \* \* \*